(12) United States Patent
Surico et al.

(10) Patent No.: US 7,864,583 B2
(45) Date of Patent: *Jan. 4, 2011

(54) ERASE VERIFY FOR MEMORY DEVICES

(75) Inventors: Stefano Surico, Milan (IT); Marco Passerini, Lozza (IT); Fablo Tassan Caser, Arcore (IT); Simone Bartoll, Cambiago (IT)

(73) Assignee: Atmel Corporation, San Jose, CA (US)

( * ) Notice: Subject to any disclaimer, the term of this patent is extended or adjusted under 35 U.S.C. 154(b) by 34 days.

This patent is subject to a terminal disclaimer.

(21) Appl. No.: 12/194,280

(22) Filed: Aug. 19, 2008

(65) Prior Publication Data

US 2008/0310232 A1 Dec. 18, 2008

Related U.S. Application Data

(63) Continuation of application No. 11/619,978, filed on Jan. 4, 2007, now Pat. No. 7,414,891.

(51) Int. Cl.
G11C 16/00 (2006.01)

(52) U.S. Cl. ............ 365/185.17; 365/185.18; 365/185.22; 365/185.29

(58) Field of Classification Search ............ 365/230.04
See application file for complete search history.

(56) References Cited

U.S. PATENT DOCUMENTS

| | | | |
|---|---|---|---|
| 5,297,096 A | 3/1994 | Terada et al. |
| 5,638,327 A | 6/1997 | Dallabora et al. |
| 5,754,469 A | 5/1998 | Hung et al. |
| 5,754,476 A | 5/1998 | Caser et al. |
| 5,768,188 A | 6/1998 | Park et al. |
| 5,777,924 A | 7/1998 | Lee et al. |
| 5,781,474 A | 7/1998 | Sali et al. |
| 5,793,679 A | 8/1998 | Caser et al. |
| 5,822,247 A | 10/1998 | Tassan Caser et al. |
| 5,835,414 A | 11/1998 | Hung et al. |
| 5,844,404 A | 12/1998 | Caser et al. |
| 5,848,013 A | 12/1998 | Caser et al. |
| 5,854,764 A | 12/1998 | Villa et al. |
| 5,862,074 A | 1/1999 | Park |
| 5,978,270 A | 11/1999 | Tanaka et al. |
| 5,982,663 A | 11/1999 | Park |
| 5,994,948 A | 11/1999 | Bartoli et al. |
| 5,999,451 A | 12/1999 | Lin et al. |
| 6,021,069 A | 2/2000 | Hung et al. |
| 6,040,734 A | 3/2000 | Villa et al. |

(Continued)

OTHER PUBLICATIONS

"U.S. Appl. No. 11/619,978, Notice of Allowance mailed Apr. 10, 2008", 5 pgs.

Primary Examiner—Tan T. Nguyen
(74) Attorney, Agent, or Firm—Schwegman, Lundberg & Woessner, P.A.

(57) ABSTRACT

Various embodiments include memory devices and methods having first memory cells and second memory cells coupled to the first memory cells in a string arrangement, first word lines configured to apply a first voltage to gates of the first memory cells during a verify operation of the first memory cells, and second word lines configured to apply a second voltage to gates of the second memory cells during the verify operation.

26 Claims, 4 Drawing Sheets

U.S. PATENT DOCUMENTS

| | | |
|---|---|---|
| 6,055,188 A | 4/2000 | Takeuchi et al. |
| 6,081,452 A | 6/2000 | Ohta |
| 6,130,841 A | 10/2000 | Tanaka et al. |
| 6,137,725 A | 10/2000 | Caser et al. |
| 6,157,054 A | 12/2000 | Caser et al. |
| 6,195,290 B1 | 2/2001 | Dallabora et al. |
| 6,320,361 B2 | 11/2001 | Dima et al. |
| 6,320,792 B1 | 11/2001 | Caser et al. |
| 6,339,551 B1 | 1/2002 | Bartoli et al. |
| 6,349,059 B1 | 2/2002 | Bartoli et al. |
| 6,353,350 B1 | 3/2002 | Bedarida et al. |
| 6,373,746 B1 | 4/2002 | Tekeuchi et al. |
| 6,385,107 B1 | 5/2002 | Bedarida et al. |
| 6,401,164 B1 | 6/2002 | Bartoli et al. |
| 6,421,276 B1 | 7/2002 | Goltman |
| 6,442,068 B1 | 8/2002 | Bartoli et al. |
| 6,442,070 B1 | 8/2002 | Tanaka et al. |
| 6,480,436 B2 | 11/2002 | Confalonieri et al. |
| 6,512,702 B1 | 1/2003 | Yamamura et al. |
| 6,624,683 B1 | 9/2003 | Bedarida et al. |
| 6,724,241 B1 | 4/2004 | Bedarida et al. |
| 6,785,183 B2 | 8/2004 | Sivero et al. |
| 6,804,148 B2 | 10/2004 | Bedarida et al. |
| 6,831,499 B2 | 12/2004 | Oddone et al. |
| 6,854,040 B1 | 2/2005 | Bartoli et al. |
| 6,912,598 B1 | 6/2005 | Bedarida et al. |
| 6,963,512 B2 | 11/2005 | Geraci et al. |
| 7,006,380 B2 * | 2/2006 | Toda .................... 365/185.21 |
| 7,130,209 B2 | 10/2006 | Reggiori et al. |
| 7,158,415 B2 | 1/2007 | Bedarida et al. |
| 7,177,198 B2 | 2/2007 | Bedarida |
| 7,181,565 B2 | 2/2007 | Surico et al. |
| 7,184,311 B2 | 2/2007 | Frulio et al. |
| 7,414,891 B2 * | 8/2008 | Sivero et al. .......... 365/185.18 |
| 7,426,141 B2 * | 9/2008 | Takeuchi ............... 365/185.11 |
| 7,440,331 B2 * | 10/2008 | Hemink ................. 365/185.22 |
| 7,457,158 B2 * | 11/2008 | Lee et al. .............. 365/185.03 |
| 2001/0019260 A1 | 9/2001 | Dima et al. |
| 2002/0018390 A1 | 2/2002 | Confalonieri et al. |
| 2002/0114207 A1 | 8/2002 | Takeuchi et al. |
| 2002/0122347 A1 | 9/2002 | Frulio et al. |
| 2003/0051093 A1 | 3/2003 | Takeuchi |
| 2003/0105941 A1 | 6/2003 | Lomazzi et al. |
| 2003/0126204 A1 | 7/2003 | Surico |
| 2003/0147293 A1 | 8/2003 | Geraci et al. |
| 2004/0046681 A1 | 3/2004 | Frulio et al. |
| 2004/0052145 A1 | 3/2004 | Sivero et al. |
| 2004/0057259 A1 | 3/2004 | Oddone et al. |
| 2004/0076037 A1 | 4/2004 | Bedarida et al. |
| 2004/0080360 A1 | 4/2004 | Bedarida et al. |
| 2006/0044885 A1 | 3/2006 | Frulio et al. |
| 2006/0062063 A1 | 3/2006 | Bedarida et al. |
| 2006/0077714 A1 | 4/2006 | Surico et al. |
| 2006/0077746 A1 | 4/2006 | Sivero |
| 2006/0083060 A1 | 4/2006 | Riva Reggiori et al. |
| 2006/0083097 A1 | 4/2006 | Frulio et al. |
| 2006/0085622 A1 | 4/2006 | Bartoli et al. |
| 2006/0114721 A1 | 6/2006 | Frulio et al. |
| 2006/0140010 A1 | 6/2006 | Bedarida et al. |
| 2006/0140030 A1 | 6/2006 | Bedarida et al. |
| 2006/0146610 A1 | 7/2006 | Takeuchi et al. |
| 2006/0161727 A1 | 7/2006 | Surico et al. |
| 2006/0250851 A1 | 11/2006 | Surico et al. |
| 2006/0253644 A1 | 11/2006 | Surico et al. |
| 2006/0279988 A1 | 12/2006 | Bedarida et al. |
| 2007/0025134 A1 | 2/2007 | Riva Reggiori et al. |
| 2007/0047325 A1 | 3/2007 | Bedarida et al. |
| 2008/0165585 A1 | 7/2008 | Surico et al. |

\* cited by examiner

ERASE VERIFY FOR MEMORY DEVICES

RELATED APPLICATIONS

This application is a Continuation of U.S. patent application Ser. No. 11/619,978, filed on Jan. 4, 2007, now U.S. Pat. No. 7,414,891, which is incorporated herein by reference in its entirety.

BACKGROUND

1. Field

The present embodiments of the invention relate to semiconductor memories, such as NAND flash memories, in which cells are serially connected to form a string. More particularly, the present embodiments of the invention relate to an erase-verify method for semiconductor memories.

2. The Prior Art

Flash memories are electrical programmable and erasable nonvolatile memories commonly used in modern electronic applications. In particular, NAND-type flash memories are becoming ubiquitous in portable data storage applications such as mobile phones, digital still cameras, mp3 players, etc. because of their characteristics of high-density and fast operations.

In NAND flash devices, the floating-gate memory cells are arranged in strings. A string consists of a series of flash cells that are connected to a bit line by means of a bit-line select transistor and to a common source line by means of a ground-select transistor. Such an arrangement is shown in FIG. 1, in which flash memory cells 12, 14, 16, and 18 are shown connected to bit line 20 through bitline select transistor 22 and to common source line 24 through ground-select transistor 26 to form a first string.

NAND strings are arranged to form a memory matrix as also shown in FIG. 1 in which, as an example, four strings of cells are shown. A second string includes flash memory cells 28, 30, 32, and 34 are shown also connected to bit line 20 through a bit-line select transistor 36 and to the common source line 24 through ground-select transistor 38. A third string includes flash memory cells 40, 42, 44, and 46 are shown connected to second bit line 48 through a bit-line select transistor 50 and to the common source line 24 through ground-select transistor 52. A fourth string includes flash memory cells 54, 56, 58, and 60 are shown also connected to the second bit line 48 through a bit-line select transistor 62 and to the common source line 24 through ground-select transistor 64. Persons of ordinary skill in the art may assume that, although each string is shown including four memory cells, the following discussion is based on each string containing sixteen cells.

In such a matrix organization, a portion of which is shown in FIG. 1, strings that share the same set of bit lines are connected to different word lines and strings connected to the same word line are controlled by different bit lines. Thus, bit word line 66 is coupled to the gates of bit-line select transistors 22 and 50. Similarly, the word line 68 for the first bits in the two strings in the top row of the portion of the matrix shown is coupled to the gates of flash transistors 12 and 40. The word line 70 for the second bits in the two strings in the top row of the portion of the matrix shown is coupled to the gates of flash transistors 14 and 42; the word line 72 for the fifteenth bits in the two strings in the top row of the portion of the matrix shown is coupled to the gates of flash transistors 16 and 44; the word line 74 for the sixteenth bits in the two strings in the top row of the portion of the matrix shown is coupled to the gates of flash transistors 18 and 46. The word line 76 for the ground-select in the two strings in the top row of the portion of the matrix shown is coupled to the gates of flash transistors 26 and 52.

In the two strings in the bottom row of the portion of the matrix shown, bits seventeen through thirty-two are shown. Bit word line 78 is coupled to the gates of bit-line select transistors 36 and 62. The word line 80 for the seventeenth bits in the two strings in the bottom row of the portion of the matrix shown is coupled to the gates of flash transistors 28 and 54. The word line 82 for the eighteenth bits in the two strings in the bottom row of the portion of the matrix shown is coupled to the gates of flash transistors 30 and 56; the word line 84 for the thirty-first bits in the two strings in the bottom row of the portion of the matrix shown is coupled to the gates of flash transistors 32 and 58; the word line 86 for the thirty-second bits in the two strings in the bottom row of the portion of the matrix shown is coupled to the gates of flash transistors 34 and 60. The word line 88 for the ground-select in the two strings in the bottom row of the portion of the matrix shown is coupled to the gates of flash transistors 38 and 64. The word line 88 for the ground-select in the two strings in the bottom row of the portion of the matrix shown is coupled to the gates of flash transistors 38 and 64.

As is shown in FIG. 2, the source line 24 is usually common to a sector or a bank of the matrix, shown within dashed lines 100 in FIG. 2. The illustrative sector 100 in FIG. 2 shows a plurality of strings 102, 104, 106, 108, 110, 112, 114, and 116 connected to different word lines and to different bit lines but sharing the same source line 24. All the cells in the same memory sector or bank are fabricated within the same p-well substrate.

To illustrate read, program and erase operations of NAND flash memory, a particular case of one bit per cell memory is considered. However, persons of ordinary skill in the art will appreciate that the principles disclosed herein apply both to single level flash memories (one bit per cell) and to multilevel flash memories (many bits per cell). For purposes of his disclosure, programmed cells have positive thresholds while erased cells have negative thresholds.

When a cell in the matrix is read, a determination is made whether the given cell has a positive threshold or a negative threshold. This determination is made by applying a zero-bias voltage ($V_{read}=0$) to the word line of the selected cell and by applying a positive read-pass voltage ($V_{read-pass}>0$) to the word lines of the other cells and to select transistors of the same string. The read-pass voltage must be high enough to turn on the unselected cells in the string, i.e., it must be higher than the maximum threshold of programmed cells in order to assure that the unselected cells are all turned on. A typical value for $V_{read-pass}$ is 4.5V.

Depending on sensing technique employed, the bit line of the selected string is biased (current sensing) or pre-charged (voltage sensing) to a positive voltage (e.g. $V_{BLread}=1V$) while other bit lines are kept grounded or floating. If the selected string sinks current through the bit line then the selected cell is erased otherwise it is programmed. The bias voltages for read operation are shown in Table I, assuming that it is desired to read the contents of memory cell 42 of FIG. 1.

| Signal Name | Bias |
| --- | --- |
| WL-BSL1 | $V_{read-pass}$ |
| WL1 | $V_{read-pass}$ |
| WL2 | $V_{read}$ |

-continued

| Signal Name | Bias |
| --- | --- |
| WL3 through WL16 | $V_{read-pass}$ |
| WL-SL1 | $V_{read-pass}$ |
| $V_{BL1}$ | 0 V |
| $V_{BL2}$ | $V_{BLread}$ |
| WL-BSL2 | 0 V |
| WL17 through WL32 | 0 V |
| WL-SL2 | 0 V |

Programming of a cell consists of moving a cell threshold value from its initial negative-value state (erased state or native state) to a positive value. This is performed exploiting Fowler-Nordheim (FN) tunneling in floating-gate transistors by applying a high program voltage (for example $V_{pgm}=18V$) to the word line of the cell to be programmed, and by applying an intermediate pass voltage (for example $V_{pass-pgm}=9V$) to the cells in the same string in which programming is to be inhibited. This will cause tunneling of electrons onto the floating gate to give it a net negative charge.

An erase operation shifts the threshold distribution of the cells to be erased from a positive value (programmed state) back to a negative value (erased state or native state). Erase is a parallel operation, i.e. many cells are erased at a time and the erase of a single cell is not permitted. Usually, in NAND flash devices, the minimum erasable unit consists of all the cells in strings that share the same set of word lines. More than one minimum erasable unit can be erased at the same time. Erasing is performed by applying a positive high voltage (for example $V_{erase}=18V$) to the p-well bulk area of the selected bank and by biasing to ground all the word lines of the units to be erased. This will cause tunneling of electrons off of the floating-gates of the cells biased at ground to give them a net positive charge and thus shift their thresholds back to their native negative value.

After every erase attempt, an erase verify operation is needed to determine whether all the cells have been successfully erased. If erase verify fails, another erase pulse is needed.

As will be appreciated by persons of ordinary skill in the art, an erase-verify operation can be performed either serially or simultaneously, the serial verify operation consists of individually verifying every single cell to be erased one at a time. This involves applying the read bias voltage ($V_{read}=0$) to the selected word line, applying a pass voltage ($V_{pass-read}$) to the unselected word line of the same unit and performing a read operation. The sequence needs to be repeated for all the word lines of the unit to be verified. Serial verify is very slow especially when long strings are used.

Simultaneous erase verify is faster than serial erase verify, and it consists of simultaneously biasing at ground ($V_{read}$) the word lines of the unit to be verified and performing a single read operation. If all the cells have been successfully erased, all strings biased at ground sink current from their respective bit lines and verify is passed. On the other hand, if just a single cell in the unit has a voltage threshold that remains higher than ground, it will not conduct and its string does not sink current. In this case, the verify fails and another erase pulse is attempted on that unit.

If more than one unit is erased in parallel, either serial or simultaneous verify need to be serially applied to all units. A new erase pulse is given only to those units that fail to pass erase verify.

Simultaneous erase verify is the most commonly used in NAND flash memories. However, this method has two drawbacks.

The first problem arises from the fact that, during erase verify, all the cells are simultaneously grounded. Due to this bias condition, the overdrive voltage of each cell is relatively low, even for correctly erased cells (i.e., for cells with negative thresholds). Because cells in a string are serially connected, the overall equivalent series resistance of the string is higher than it would be during a read operation (i.e., when only one cell is grounded and other cells are biased at $V_{pass-read}$). This implies a low verify current that is critical for both current sensing and voltage sensing methods.

If a current sensing technique is used, the read circuit compares the string current with a reference current. Low-current operations impact sense circuit precision and speed. Moreover noise and disturbs might negatively affect circuit operation. Under these conditions, the design of the sense circuit becomes more critical.

If a voltage sensing technique is used, the bit line is precharged to a given value. If the erase operation is successful, the bit line will be discharged by the string current. In this case, operating with a low current means that a long time is required to discharge the bit line.

If not enough time is allowed for bit-line discharge, there is the risk of ending up with over-erased cells. If enough time has not elapsed to fully discharge the bit line, correctly-erased cells might be misinterpreted by the read buffer due to insufficient bit-line discharge, and sensed as still programmed. In this case another erase pulse would be applied and would likely over-erase the cells. It is worth noting that over-erase is not recommended in NAND flash memories because it slows erase operation (unnecessary erase pulses are applied) and unnecessarily over stresses cells, a process that can negatively impact on device cycling performances.

The second problem inherent in simultaneous-erase verify is caused by control-gate-to-floating-gate and floating-gate-to floating-gate interference effects of adjacent cells. As NAND flash memory design rules are scaled down, the cell pitch in the string decreases and parasitic coupling capacitances between adjacent cells play an increasingly important role.

Consider any cell to be read in a particular string in FIG. 1, and assume the cells in the string are all erased. In read operations, adjacent cells are biased to 4.5V, while in simultaneous-erase verify adjacent cells are grounded. Therefore, during read operations, adjacent cell bias tends to facilitate selected cell turn-on because of parasitic coupling, resulting in a lower apparent threshold voltage for the selected cell with respect the case of erase-verify operation. In fact, in the latter case, when adjacent cells are grounded, parasitic coupling does not influence selected cell turn-on, and the voltage threshold appears to be higher than in the read case. Therefore, the simultaneous-erase verify method may lead to cell over-erase caused by unnecessary additional erase pulses.

BRIEF DESCRIPTION

An erase verify method for a NAND flash memory includes a serial double-step erase verify. A verify operation is performed on cells in the unit connected to even word lines by biasing all the even word lines at the read voltage value used in read mode, and by biasing all the odd word lines at the pass voltage value used in read mode of the selected unit. A verify operation is performed on the cells connected to odd word lines by biasing all the odd word lines at the read voltage value used in read mode and by biasing the all even word lines at the pass voltage value used in read mode of the selected unit. Verifying the odd and even word lines may be performed in either order.

BRIEF DESCRIPTION OF THE DRAWING FIGURES

DETAILED DESCRIPTION

Persons of ordinary skill in the art will realize that the following description of the present embodiments of the invention is illustrative only and not in any way limiting. Other embodiments of the invention will readily suggest themselves to such skilled persons.

An erase-verify sequence according to the present embodiments of the invention increases the verify current of the memory-cell strings and minimizes or cancels the difference in apparent thresholds between erase-verify and read operations. The method consists of a serial double-step erase verify process. This process is illustrated in FIGS. 3A and 3B.

Figure 1:
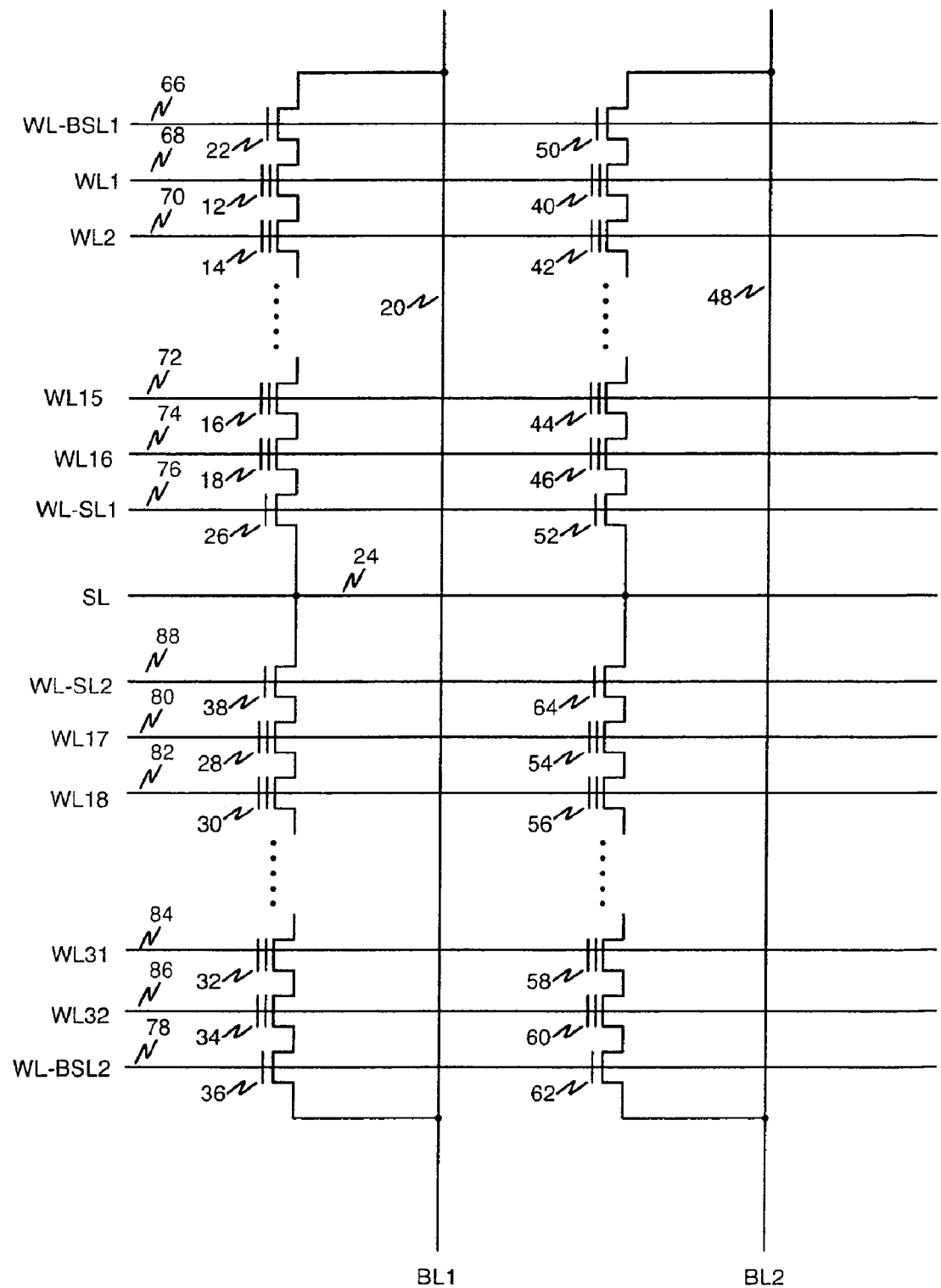
FIG. 1 is a diagram of a portion of a typical NAND flash memory array including four illustrative strings of memory cells.
Figure 2:
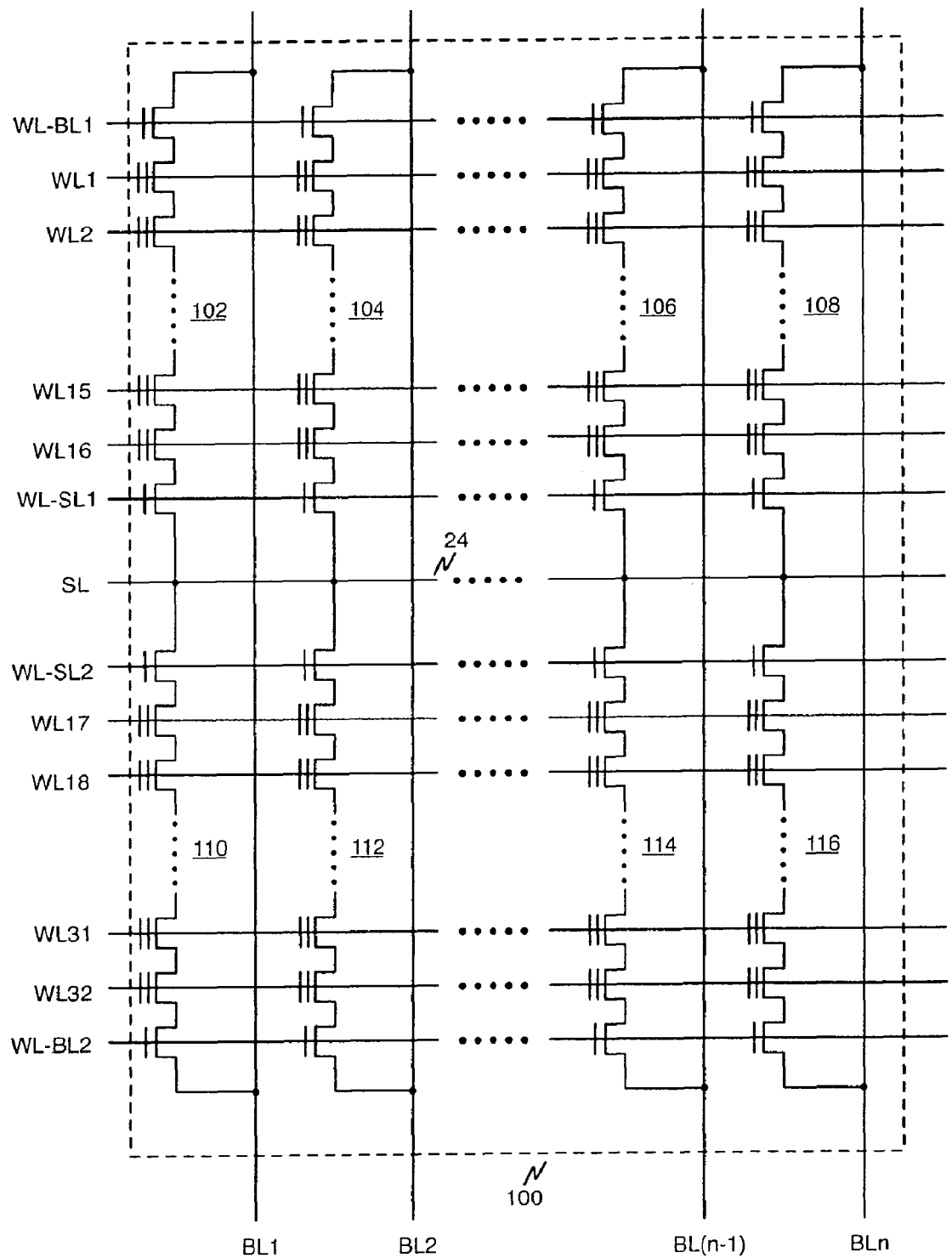
FIG. 2 is a diagram of a portion of a typical NAND flash memory showing an illustrative memory sector.
Figure 3A:
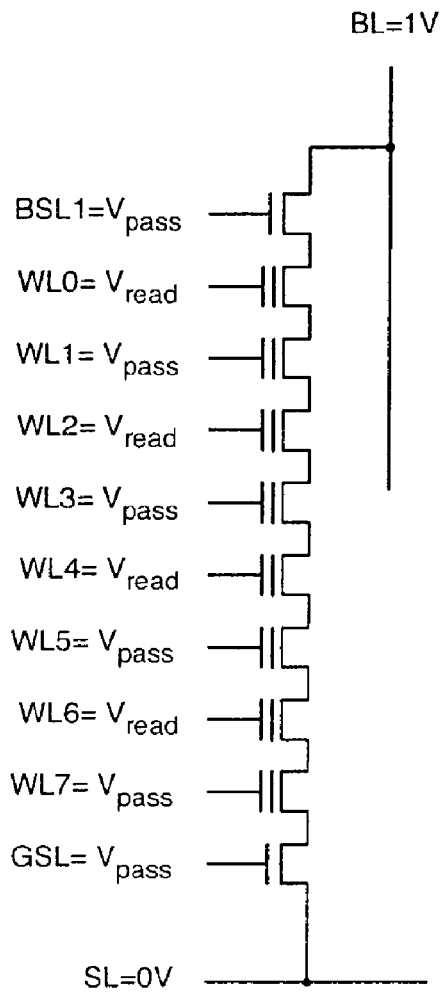
FIGS. 3A and 3B are simplified schematic diagrams of an illustrative string in a NAND flash array showing bias conditions for the two-step erase verify method of the present embodiments of the invention.

First, as shown in FIG. 3A, a verify operation of cells in the unit connected to a first group of word lines only (e.g., even word lines) is performed. This is obtained by biasing all of the word lines in the first group at the read voltage value used in read mode (e.g. $V_{read}$=0V), and by biasing all of the other word lines at the pass voltage value used in read mode (e.g. $V_{pass}$=4.5V) of the selected unit. As a non-limiting example for a string comprising eight cells and where the groups of cells are an odd group and an even group, WL0, WL2, WL4, and WL6 in the even group are biased at $V_{read}$, while WL1, WL3, WL5, and WL7 in the odd group are biased at $V_{pass}$. The word lines for bit-line and ground-select transistors are also biased at $V_{pass}$.

Figure 3B:
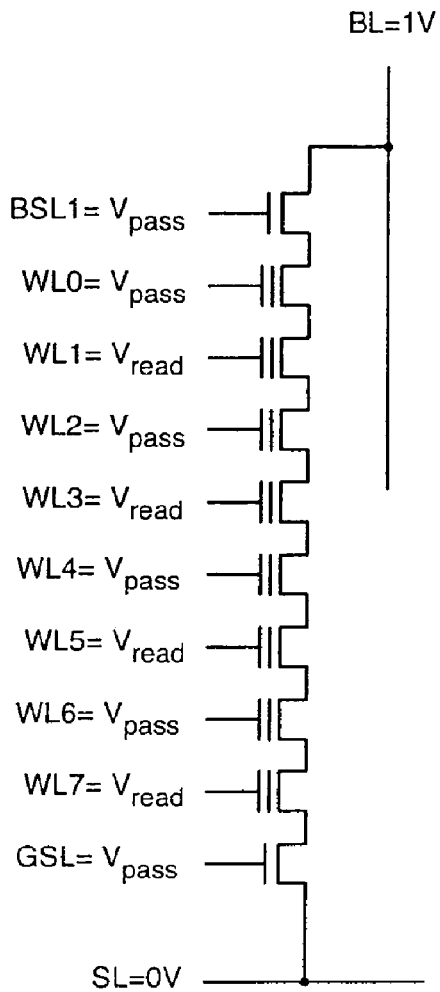

Next, as shown in FIG. 3B, a verify operation of cells in the unit connected to a second group of word lines only (e.g., odd word lines) is performed. This is obtained by biasing at $V_{read}$ all of the word lines in the second group and by biasing at $V_{pass}$ all of the other word lines of the selected unit. In the example of FIG. 3B, WL1, WL3, WL5, and WL7 in the odd group are biased at $V_{read}$, while WL0, WL2, WL4, and WL6 in the even group are biased at $V_{pass}$. The order of the first and second (e.g., even and odd) verify operations may be reversed if desired, with no impact on erase-verify performances.

As will be appreciated by persons of ordinary skill in the art, during each of the first and second verify operations, only half of the cells in the string are biased at $V_{read}$, while the other half of the cells are biased well into their on state. Assuming that the series resistance exhibited by cells biased at $V_{pass}$ is considered to be negligible with respect to that of cells biased at $V_{read}$, the current available for verify with the present method is almost the double that of available prior-art simultaneous-verify techniques. This characteristic relaxes design requirements for the sense amplifier, resulting in a less critical operation.

Moreover, during verify with the method of the present embodiments of the invention, each cell has two adjacent cells biased at $V_{pass}$. This is exactly the same condition experienced by the cell during read operation. Therefore the gate-interference effects that are present in the prior art are completely cancelled.

Time performances of the method of the embodiments of the invention depends on the specific implementation, particularly on the sensing technique. For example, in the case of voltage sensing (the most common used in NAND flash memories), a considerable amount of the erase verify time is needed for bit-line discharge. In this case, each verify step of the method proposed in the embodiments of the invention takes about half the time needed by the prior-art simultaneous-verify operation to discharge the bit line, because of the increased string current that flows as a result of halving the total resistance of the string. Therefore, the method of the embodiments of the invention is only slightly slower than simultaneous verify when erase is accomplished in one single pulse, but it is faster when more than one erase pulse is required.

To better understand this aspect of the present embodiments of the invention, consider a situation in which the correct erase of one unit is obtained with two subsequent erase pulses, and as an example, assume that a cell connected to one of the word lines fails to be erased at the first pulse. If simultaneous erase verify is used, the overall erase time ($t_e$) is given by the sum of the two erase pulse times ($t_p$) and of the two erase verify times ($t_s$): $t_e=2t_p+2t_s$. This is shown in 4A.

Figure 4A:
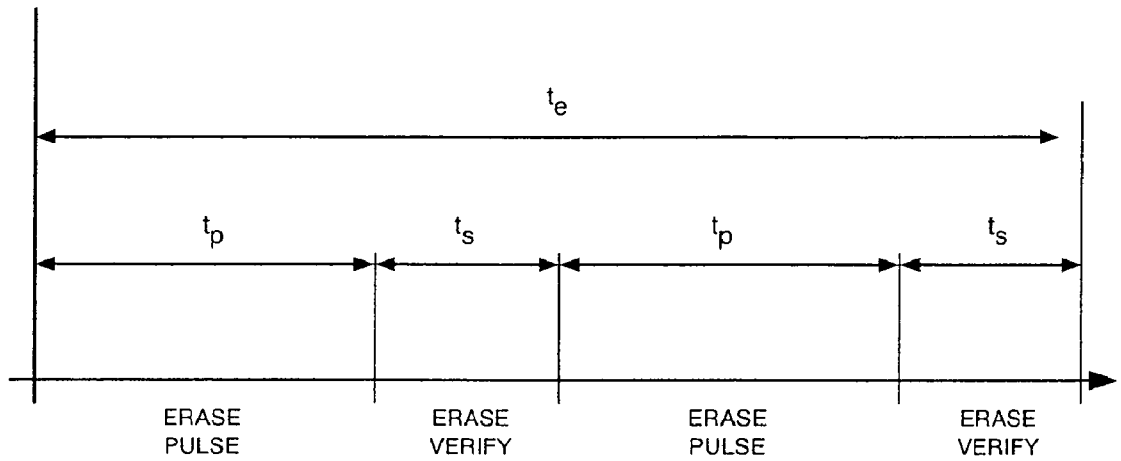
FIGS. 4A and 4B are diagrams showing the difference between simultaneous erase verify methods and the method of the present embodiments of the invention in the case where two erase pulses are required.
Figure 4B:
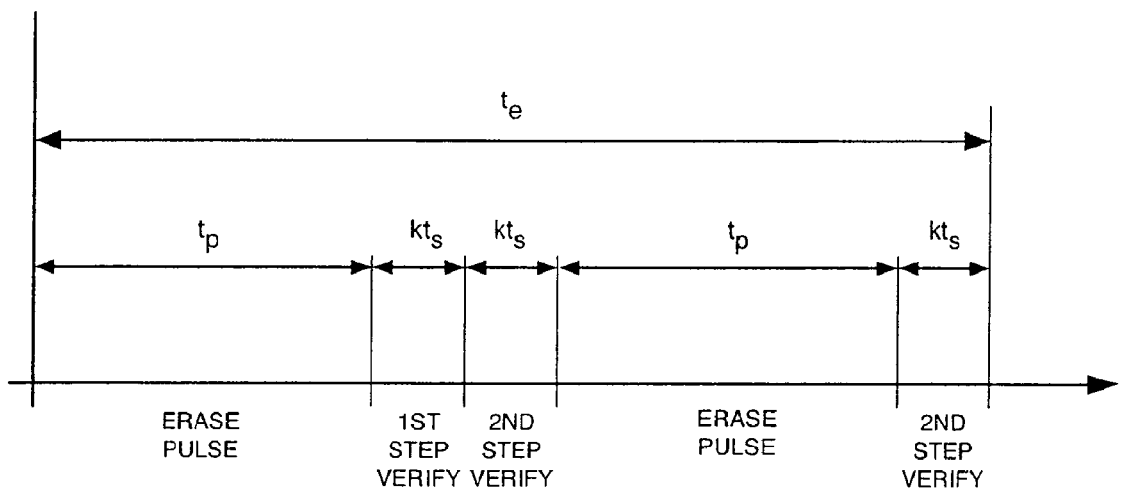

This operation may be contrasted with the timing of the operation of the erase-verify operation according to the present embodiments of the invention as shown in FIG. 4B. After the first erase pulse, a first erase verify operation is performed on the even word lines. This process takes a shorter time than the simultaneous erase-verify operation because the increase in string current allows a faster bit line discharge. Therefore, the time needed for this process ($t_1$) is a fraction of the time needed for a simultaneous erase verify: $t_1=kt_s$, with $0.5 \leq k \leq 1$. Of course the longer the time needed for bit line discharge with respect the overall erase verify time, the closer k is to 0.5. Next, a second erase verify operation is performed on the odd word lines. The time needed for this process is also $kt_s$. The second step fails, since it assumed that the one cell was not correctly erased.

A second erase pulse is then applied. However, only erase verify for the odd word lines is needed since erase verify has already passed for the even word lines after the first erase pulse. The overall erase time is then given by: $t_e=2t_p+2kt_s+kt_s=2t_p+3kt_s$. It follows that, if $k<\frac{2}{3}$, then the erase-verify process of the present embodiments of the invention is faster than the prior-art simultaneous erase-verify process.

The more erase pulses necessary to perform the operation, the less the time required using the method of the present embodiments of the invention as contrasted with the prior-art method. In general, if np is the number of pulses needed to perform the erase operation, the present method is faster than simultaneous verify if $k<np/(np+1)$.

Different analysis is needed for current sensing technique for which the sense-time reduction due to a doubling of the string current might be very low, i.e. k close to 1. At worst, if it is assumed that erase of all cells is accomplished using a single erase pulse and sense-time reduction due to improved cell string current is negligible, the erase verify according to the present embodiments of the invention would take twice the time of simultaneous verify (two step need to be performed instead of one). However, current sensing is usually much faster than voltage sensing and the time overhead inherent in use of the method of the present embodiments of the invention may be negligible with respect the overall erase time.

The method of the present embodiments of the invention can be extended by splitting the erase-verify process into more than two segments to further increase the string current for each segment. For example, referring to the eight-bit string of FIGS. 3A and 3B, a four-step sequence is possible by grouping the word lines in such a way that each word line biased at $V_{read}$ is surrounded by a word line biased at $V_{pass}$. As an example, the word lines may be grouped such that in one segment WL0 and WL2 are biased at $V_{read}$ while the other word lines are biased at $V_{pass}$; in another segment WL1 and WL3 are biased at $V_{read}$ while the other word lines are biased at $V_{pass}$; in another segment WL4 and WL6 are biased at $V_{read}$ while the other word lines are biased at $V_{pass}$; in another segment WL5 and WL7 are biased at $V_{read}$ while the other word lines are biased at $V_{pass}$. In this four-segment example, the current string is increased by a factor of 4 with respect the simultaneous verify. Similar partitioning will readily suggest itself to persons of ordinary skill in the art for strings having other numbers of memory cells.

In general, it is possible to split the erase verify in 2n steps, where n is an integer $<\log 2(M)$ where M is the number of the cells in a string. Of course a trade-off is necessary between sense current and overall erase verify time. Note that the case of M steps (i.e., n=log 2(M)) erase verify corresponds to the prior art serial erase verify for which the verify time is maximum.

The present embodiments of the invention propose an erase verify sequence split in s serial steps, with $1 \leq s \leq M$, being M the number of the cells forming a string. For each step, the word lines of the cells to be verified are biased at $V_{read}$ and are surrounded by word lines at $V_{pass}$, being $V_{read}$ equal to the bias voltage applied to the selected word line during read operation, and $V_{pass}$ equal to the pass voltage applied to unselected word lines of the selected string during read operation, to overcome coupling interference effects.

With this method, the sensing current is enhanced by a factor s and design constraints of the sense circuit can therefore be relaxed. Moreover if the case s=2 is implemented, the method of the present embodiments of the invention is almost as fast as the simultaneous erase-verify method when the voltage sensing technique is employed, and is faster than the simultaneous erase-verify method when a single pulse is not enough to perform the erase operation. Erase-verify methods split into more than two steps may be implemented according to the present embodiments of the invention, but the trade-off between the increase in string current and the increase in erase verify time must be considered.

While various embodiments of the invention and applications of the invention have been shown and described, it would be apparent to those skilled in the art that many more modifications than mentioned above are possible without departing from the inventive concepts herein. The embodiments of the invention, therefore, are not to be restricted except in the scope of the appended claims.

What is claimed is:

1. A memory device comprising:
   first memory cells and second memory cells coupled to the first memory cells in a string arrangement;
   first word lines coupled to first gates of the first memory cells and configured to apply a first voltage to the first gates during a first verify operation of the first memory cells; and
   second word lines coupled to second gates of the second memory cells and configured to apply a second voltage to the second gates during the first verify operation, wherein the second word lines are further configured to apply the first voltage to the second gates during a second verify operation of the second memory cells, and the first word lines are configured to apply the second voltage to the first gates during the second verify operation.

2. The memory device of claim 1, wherein the first voltage is less than the second voltage.

3. A memory device comprising:
   first memory cells and second memory cells coupled to the first memory cells in a string arrangement;
   first word lines coupled to first gates of the first memory cells and configured to apply a first voltage to the first gates during a first verify operation of the first memory cells; and
   second word lines coupled to second gates of the second memory cells and configured to apply a second voltage to the second gates during the first verify operation, wherein one of the first memory cells is between two of the second memory cells, and one of the second memory cells is between two of the first memory cells.

4. The memory device of claim 3, wherein the first voltage is about zero volts.

5. A memory device comprising:
   at least one string of memory cells including first memory cells, second memory cells, third memory cells, and fourth memory cells;
   first word lines coupled to first gates of the first memory cells and configured to apply a first voltage to the first gates during a first verify operation of the first memory cells;
   second word lines coupled to second gates of the second memory cells and configured to apply a second voltage to the second gates during the first verify operation;
   third word lines coupled to third gates of the third memory cells and configured to apply the second voltage to the third gates during the first verify operation; and
   fourth word lines coupled to fourth gates of the fourth memory cells and configured to apply the second voltage to the fourth gates during the first verify operation.

6. The memory device of claim 5, wherein the first voltage includes a voltage used to apply to the first gates during a read operation to read the first memory cells.

7. The memory device of claim 5, wherein the second word lines are further configured to apply the first voltage to the second gates during a second verify operation of the second memory cells, and wherein the first word lines, the third word lines, and the fourth wordlines further configured to apply the second voltage to the first gates, the third gates, and the fourth gates during the second verify operation.

8. The memory device of claim 7, wherein the third word lines are further configured to apply the first voltage to the third gates during a third verify operation of the third memory cells, and wherein the first word lines, the second word lines, and the fourth wordlines further configured to apply the second voltage to the first gates, the second gates, and the fourth gates during the third verify operation.

9. The memory device of claim 8, wherein the fourth word lines are further configured to apply the first voltage to the fourth gates during a fourth verify operation of the fourth memory cells, and wherein the first word lines, the second word lines, and the third wordlines are configured to apply the second voltage to the first gates, the second gates, and the third gates during the fourth verify operation.

10. The memory device of claim 9, wherein, one of the first memory cells is between two of the second memory cells, one of the second memory cells is between two of the first memory cells, one of the third memory cells is between two of the fourth memory cells, and one of the fourth memory cells is between two of the third memory cells.

11. A memory device comprising:
at least one string of first memory cells and second memory cells, one of the first memory cells is between two of the second memory cells, and one of the second memory cells is between two of the first memory cells;
first word lines coupled to first gates of the first memory cells and configured to apply to the first gates a first voltage during a first verify operation of the first memory cells after an erase operation of the first memory cells and the second memory cells; and
second word lines coupled to second gates of the second memory cells and configured to apply to the second gates a second voltage during the first verify operation.

12. The memory device of claim 11, wherein the second word lines are further configured to apply the first voltage to the second gates during a second verify operation of the second memory cells after the first verify operation, and the first word lines are configured to apply the second voltage to the first gates during the second verify operation.

13. The memory device of claim 11, wherein the first voltage is equal to a voltage applied to the first gates during a read operation to read the first memory cells.

14. A method comprising:
applying a first voltage to first gates of first memory cells to perform a first verify operation of the first memory cells;
applying a second voltage to second gates of second memory cells during the first verify operation of the second memory cells;
applying the first voltage to the second gates to perform a second verify operation of the second memory cells; and
applying the second voltage to the first gates during the second verify operation of the second memory cells.

15. The method of claim 14, wherein applying a first voltage includes applying a voltage equal a voltage used to apply to the first gates during a read operation to read the first memory cells.

16. The method of claim 15, wherein applying the second voltage includes applying a voltage having a positive value.

17. The method of claim 14, wherein one of the first memory cells is between two of the second memory cells, and one of the second memory cells is between two of the first memory cells.

18. The method of claim 14, wherein the first voltage includes a ground potential.

19. A method comprising:
applying a first voltage to first gates of first memory cells during a first verify operation of the first memory cells;
applying a second voltage to second gates of second memory cells during the first verify operation;
applying the second voltage to third gates of third memory cells during the first verify operation; and
applying the second voltage to fourth gates of fourth memory cells during the first verify operation.

20. The method claim 19 further comprising:
applying the first voltage to the second gates during a second verify operation of the second memory cells; and
applying the second voltage to the first gates, the third gates, and the fourth gates during the second verify operation.

21. The method of claim 20 further comprising:
applying the first voltage to the third dice during a third verify operation of the third memory cells; and
applying the second voltage to the first gates, the second gates, and the fourth gates during the third verify operation.

22. The method of claim 21 further comprising:
applying the first voltage to the fourth gates during a fourth verify operation of the fourth memory cells; and
applying the second voltage to the first gates, the second gates, and the third memory cells during the fourth verify operation.

23. A method comprising:
applying a first erase pulse to erase at least one string of first memory cells and second memory cells, one of the first memory cells is between two of the second memory cells, and one of the second memory cells is between two of the first memory cells;
performing a first verify operation of the first memory cells;
performing a second verify operation of the second memory cells;
applying a second erase pulse to erase the first memory cells and second memory cells if at least one of the second memory cells was not correctly erased with the first erase pulse; and
performing an additional verify operation of the second memory cells after the second ease pulse is applied without performing an additional verify operation of the first memory cells.

24. The method of claim 23 wherein performing the first verify operation includes applying a first voltage to first gates of first memory cells, and applying a second voltage to second gates of second memory cells.

25. The method of claim 24 wherein performing the second verify operation includes applying the first voltage to the second gates, and applying the second voltage to the first gates.

26. The method of claim 25, wherein applying a first voltage includes applying a voltage equal a voltage used to apply to the first gates during a read operation to read the first memory cells.

* * * * *